March 14, 1961 R. H. REDIKER 2,975,342

NARROW BASE PLANAR JUNCTION PUNCH-THRU DIODE

Filed Aug. 16, 1957

INVENTOR.
ROBERT H. REDIKER

BY Edward P. Thomas

AGENT

United States Patent Office 2,975,342
Patented Mar. 14, 1961

2,975,342

NARROW BASE PLANAR JUNCTION PUNCH-THRU DIODE

Robert H. Rediker, Watertown, Mass., assignor, by mesne assignments, to Research Corporation, New York, N.Y., a corporation of New York Filed Aug. 16, 1957, Ser. No. 678,611

12 Claims. (Cl. 317—234)

The present invention relates to semiconductor diodes and more particularly to a planar junction diode with a very narrow base width.

The development of high speed electronic digital computers has focused attention on the fundamental parameters of components which affect the speed of computation. The use of semiconductor diodes in computer applications makes the speed of response of diodes to switching voltage pulses a matter of considerable importance. For this reason there have appeared in technical journals from time to time a number of papers dealing with the mathematical treatment of the switching problem and the critical parameters of junction diodes. Reference may be made by way of example to "Switching Time in Junction Diodes," by Robert H. Kingston in Proceedings of the Institute of Radio Engineers, volume 42, May 1954, or the paper by B. Lax and S. F. Neustadter in Journal of Applied Physics, volume 25, page 1148, 1954. Studies of this sort indicate that the switching transient is separated into two phases; first, one of constant current where the flow is limited by the external resistance; second, a phase where the current decays at a rate determined by the minority carrier lifetime and the dimensions of the diode. For a given minority carrier lifetime, the general results indicate that narrow base planar junction diodes, where the base width is very narrow compared with the diffusion length for the minority carriers, will have substantially smaller switching times than conventional planar junction diodes.

Further, for computers which employ transistors, as well as other computer applications such as ladder networks, there is a demand for a diode with a very low forward resistance at low forward bias voltage and a very small switching time. At the current levels involved of the order of one milliampere, for an optimum diode the junction voltage is much larger than the voltage across the diode bulk resistance. To increase the junction current per unit area for a given junction voltage, the base thickness can be reduced, the lifetime of minority carriers in the base material can be reduced and/or the resistivity of the base material can be increased. At present, techniques have yet to be perfected to grow very low lifetime materials without introducing excessive dislocations. Increasing the junction area to increase junction current also increases the junction capacitance and, in general, makes the diode less useful in computer applications.

Consequently, the present invention contemplates obtaining rapid switching time and low forward resistance in a planar junction diode by placing the base ohmic contact very close to the p-n junction thereby both reducing the ohmic resistance of the base and increasing the junction current per unit area. The planar alloy junction structure is preferred because the alloyed junction current-voltage characteristic more closely follows the ideal diode law: $I=I_0(\rho^{qV/kT}-1)$ than do gold-bonded or point contact junctions on germanium and because the planar geometry lends itself to a low ohmic bulk resistance. A planar diffused junction has been used. Gold-bonded junction diodes in which the base thickness is at least one order of magnitude smaller than the junction diameter are also considered. The current-voltage characteristic of very narrow base diodes is also a function of the degree of imperfection of the ohmic contact. If it were possible to make the ohmic contact perfect, the diode would exhibit extremely poor rectification. However, practical ohmic contacts exhibit a rectification ratio of the order of $10^5$ to $10^6$. Because of the small spacing between the rectifying contact and the ohmic contact for base widths in the range of 1 to 20 microns, hole storage effects are minimized and a series bulk resistance below 3 ohms is easily obtained. Because of the very small value possible for the product of series bulk resistance and junction capacitance, the narrow-base diode is useful as a high frequency device both for small signal applications and switching applications. In addition to reducing the series bulk resistance, the narrow base width reduces the diffusion capacitance that limits the frequency of operation in forward bias.

In addition to the foregoing considerations, a narrow base planar junction diode exhibits a non-destructive breakdown effect which is not found in conventional junction diodes but which is well known for transistors. For an impure semiconductor material, such as n-type germanium, fixed impurity charges are present, compensated by mobile charged carriers which for n-type germanium are electrons. For any applied back bias voltage across a diode, the mobile charges have moved out of a region adjacent to the junction leaving only fixed charges, thereby producing a space charge region which is also called the depletion layer. When the applied voltage across the junction is increased to the value at which the space charge region, i.e. the depletion layer, "punches-thru" to the ohmic contact, the diode has a low dynamic impedance. While before "punch-thru" the impedance of the diode is simply that of a back-biased rectifier, of the order of megohms, after "punch-thru" the dynamic impedance is reduced to the region of a hundred ohms or so. The punch-thru breakdown is distinct from the so-called "avalanche" breakdown and "Zener" breakdown and is determined by Poisson's equation which relates voltage to the charge necessary to produce the voltage. The punch-thru voltage depends upon the fixed charge density of the base material, upon the base width and upon the inherent electrostatic potential of the junction. The switching time between the high impedance reverse bias state and the low impedance punch-thru state is capacitance limited, since the dielectric relaxation time can be considered negligible, and leads to values below 10 mμsec.

Three different techniques have been used for producing the narrow base width essential for the punch-thru diode. These techniques are: (*a*) controlled selective bath etching, (*b*) depletion-layer jet etching, and (*c*) the outdiffusion of donor impurities from compensated n-type germanium.

For both selective bath etching and depletion-layer jet etching, the diodes are first prepared by alloying an indium button into n-type germanium by conventional means. Simultaneously with the alloying, an antimony-gold plated Kovar ring is bonded to the germanium to be used as an auxiliary ohmic contact during further fabrication. After the alloy rectifying contact is cleaned up by conventional methods, the devices are ready for the etching technique.

The prerequisite for the outdiffusion technique is the growing of compensated n-type germanium crystals of semiconductor quality. The crystals are then cut into wafers that are lapped and polished. The wafers are then treated to remove metal impurities, in order to minimize resistivity changes and lifetime degradation of the germanium during diffusion.

After the narrow base width has been produced by one of the three processes, an ohmic base contact must be placed in the germanium opposite the rectifying contact. Since the base width is controlled by the etching or diffusion techniques, the penetration into the germanium of the ohmic contact must be kept to a small fraction, say less than ten percent, of the base width.

The principal object of the invention is a semiconductor planar junction diode with a very narrow base width compared with the diffusion length for minority carriers in the base material.

Another object is a semiconductor planar junction diode having a very narrow base width which is accurately controlled during fabrication.

Another object is a semiconductor planar junction diode wherein the space-charge region of the junction reaches the ohmic contact at a voltage which is accurately controlled in manufacture.

A further object is a semiconductor planar junction diode having a narrow base width in the range of 1 to 20 microns having the characteristics of low forward resistance, low junction capacitance, low diffusion capacitance, capacitance limited reverse recovery time and a forward switching time negligible with respect to its reverse recovery time.

A further object is a semiconductor planar junction diode having three stable states of conduction defined by a high impedance region with reverse bias, a low impedance region with reverse bias at a voltage greater than punch-thru voltage and a low impedance region with forward bias and having very rapid switching times between one stable state and another.

Other objects of the invention will be in part obvious and in part pointed out as the description proceeds.

Figure 1:
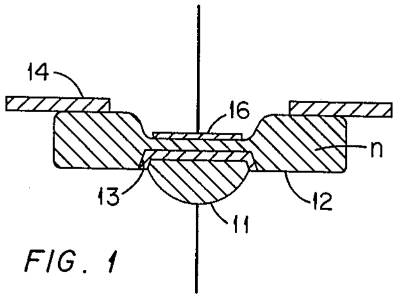
Figure 1 is a cross section of a homogeneous-base punch-thru diode shown on an enlarged scale.

With reference to Figure 1, the diodes of the invention, made by either of the etching processes, first have an indium or indium alloy button 11 alloyed into a wafer 12 of n-type germanium by conventional means to produce a rectifying contact, 13. An alloy of 89.8% indium, 10% silver, 0.2% gallium has been found to be particularly effective. An auxiliary ohmic contact is then made to the opposite side of the wafer, for example, by bonding an antimony-gold plated Kovar washer 14 arranged to be concentric with the rectifying contact 11.

Figure 2:
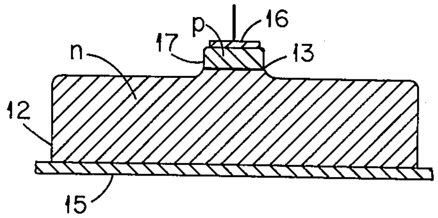
Figure 2 is a cross section of a graded base outdiffused punch-thru diode shown on an enlarged scale.

The controlled selective bath etching is carried out with the circuit of Figure 2 and is described in detail in an application by David Sawyer and Robert Rediker, Serial No. 697,944, filed November 21, 1957, for "Method of Fabricating Semiconductor Junctions" and assigned to the same assignee as the present application, and now abandoned. Briefly, the electrolyte 24 is an aqueous solution of 7.4 grams per liter of indium trichloride and 2.1 grams per liter of hydrochloric acid. Bath agitation is provided by feeding electrolyte at low pressure through a 0.006 in. nozzle, not shown, placed above the germanium surface. It is essential that the alloyed diode's characteristics do not deteriorate during bath etching and that the electrolyte is not permitted to come in contact with Kovar ring 14. These requirements are satisfied by restricting the electrolyte to that area of germanium within the Kovar ring. A plastic washer 25 is fitted into the bottom of container 26 and extends 0.020 in. below the lower surface thereof. The rim of washer 25 is coated with a silicone-type grease. The diode assembly is lightly clamped to the etching bath container 26 with spring clips, not shown, that also make electrical contact to Kovar ring 14 and indium button 11. Plastic washer 25 fits inside Kovar ring 14 and the thin coating of silicone compound prevents the bath electrolyte 24 from reaching ring 14 or from leaking to the rectifying contact. When the diode assembly is removed from the etching process, the silicone compound is removed from the germanium surface.

When the double-pole double-throw switch 27 is connected to contacts E, as shown in Figure 2, a depression is being etched into the germanium surface opposite indium button 11. The electrolyte is biased negative with respect to the germanium surface by means of voltage source 23 connected through switch 27 to platinum electrode 28, while the diode assembly is forward biased by the current source composed of resistor 21 and voltage source 22 applied to contact 11 by switch 27. The etching of n-type germanium is limited by the flow of holes. These holes, injected at the fused junction 13, diffuse across the n-type germanium base and participate in the etching process at the germanium-electrolyte interface.

Figure 4:
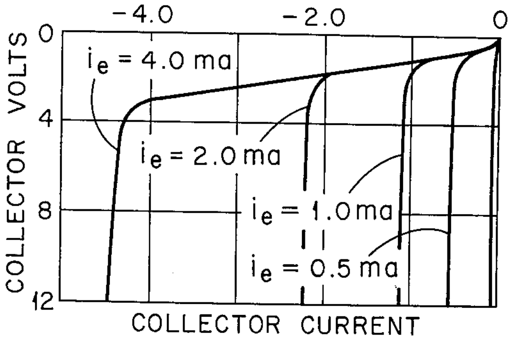
Figure 4 is a graph illustrating the characteristics of the diode in the electrolytic bath etching process.

During etching, the terminal characteristics of the bath assembly resemble those of a p-n-p junction transistor whose $\alpha$ may exceed unity, so the alloy button current may be designated as the "emitter" current and the current through the electrolyte as the "collector" current. If the seal between the top surface of the n-type germanium base and the plastic washer 25 is water-tight, good collector saturation characteristics are obtained with slopes in the megohm range. I find that the magnitude of the saturation current agrees well with that calculated from the area of germanium exposed to the electrolyte and the thermal generation rate of minority carriers (holes) in the n-type base. The $\alpha$ of the bath assembly for a given emitter current is controlled by the collector voltage. Collector voltage as used here is the voltage applied between platinum electrode 28 and the diode Kovar washer 14. A typical collector family is shown in Figure 4, which is essentially the same for electrolytes of resistivities ranging from 6 to 500 ohm-cm.

The radius of curvature of the etched germanium can be controlled by control of the base current. If, for a given emitter current, the collector voltage is sufficient to obtain collector-current saturation, the direction of base current flow is into the base since $\alpha>1$. This causes a voltage drop to occur laterally in the base beneath the fusion area. The polarity of this voltage is such that it produces greater hole injection near the center of the emitter area than at the emitter periphery. As etching continues, the base becomes progressively thinner, and for a given constant emitter current, the etching localizes even more at the center of the fusion. On the other hand, with the collector voltage somewhat below that necessary for collector saturation ($\alpha<1$), the base current is out of the base. The lateral base voltage now tends to bias off the center region of the emitter so that etching should occur at a faster rate at the periphery than at the center. The curvature of the etched depression expected from the above considerations is decreased somewhat because, although hole injection is reduced where the base region is more positive, the electrolyte-germanium voltage is increased. As shown in Figure 4, however, the collector current is not a rapidly varying function of collector voltage, even in the region of $\alpha<1$. The etching rate is much more sensitive to hole injection than to the electrolyte-germanium voltage. Therefore, it is possible to vary the contour of the etched surface opposite the emitter from concave through flat to convex by control of base current.

This method of control is contingent upon the collector and base contacts not being bridged within the bath by an electrolyte path and thus requires the water-tight seal by means of the silicone compound as described above. Hole injection via the alloyed junction not only yields well delineated etched surfaces of controlled curvature, but also minimizes surface pitting. Unless a source of holes is provided by such means as optical generation or hole injection, electrolytic methods of etching n-type germanium at practical rates of germanium removal usually leads to excessive surface pitting.

Figure 3:
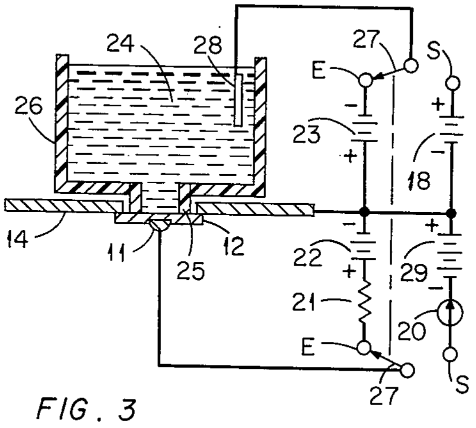
Figure 3 is a sketch of the circuit diagram employed in the controlled selective bath etching process for fabricating narrow base diodes.

In order to produce diodes exhibiting punch-thru breakdown at a predetermined amplitude of back bias voltage, the etching must be stopped when a predetermined base thickness remains opposite the alloyed junction. When switch 27 of Figure 3 is positioned to connect to contacts S, the thickness of the n-type germanium region remaining between the p-type recrystallized region under indium button 11 and the surface of the etched depression is being sensed. The electrolyte is biased positive with respect to the germanium by voltage source 18 and indium is plated onto the germanium surface. Also, a reverse bias voltage $V_p$ from voltage source 29 is applied across the indium alloyed junction 13. The voltage from source 29 creates a space-charge region that penetrates from the alloyed junction a distance W into the base. Using Poisson's equation, the equation that relates W to the base resistivity $\rho$ in ohm-centimeters and $V_p$ in volts is found to be:

$$W=1.01\times10^{-4}\sqrt{(V_p)\rho}\text{ cm.} \qquad (1)$$

Figure 8:
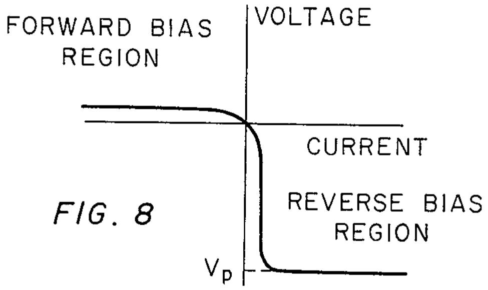
Figure 8 is a graph showing the general current-voltage characteristic of a punch-thru diode.

When etching has proceeded so that the space charge region of the reverse-biased diode reaches the p-type inversion layer under the plate being deposited the reverse current of the diode increases as illustrated in Figure 8. This increase in current flowing through meter relay 20 actuates contacts, which are not shown, to stop further etching. By adjusting the amplitude of voltage source 29 and the germanium resistivity, diodes having final punch-thru voltages ranging from 5 to 30 volts and final base thicknesses, W, from 2 to 10 microns are readily produced, although the process need not be limited to these values.

For the circuit of Figure 3, the etching period is typically 2 seconds, the etching voltage 23 is 3 volts, the etching current is 4 milliamperes and the alloyed junction forward current is 4 milliamperes. The sensing period is 0.5 second, the plating current is 0.3 milliampere, and the sensing voltage $V_p$ may vary between 1 to 100 volts dependent upon the predetermined thickness W of the n-type germanium base selected or the desired value of punch-thru voltage. Switch 27 obviously may be motor driven to advantage to provide automatically the cyclic operation of etch followed by sensing. It should also be noted that the indium plate deposited during the sensing period of the cycle is etched off during the initial part of the following etch period.

Figure 5:
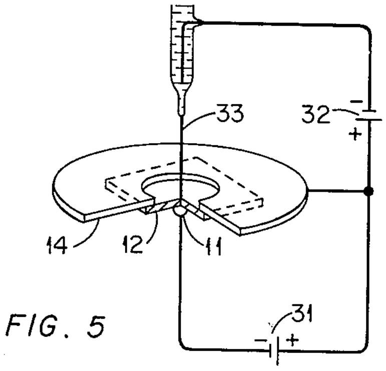
Figure 5 is a perspective drawing illustrating the depletion layer jet etching technique for fabricating narrow-base diodes.

The depression opposite the alloyed junction can also be obtained by a depletion-layer jet etching technique illustrated in Figure 5. This technique was described by W. E. Bradley at the Meeting of the Electrochemical Society, Cincinnati, Ohio, May 1955. A satisfactory electrolyte for jet etching germanium is an aqueous solution of 2.2 grams per liter of sodium nitrite. Briefly, in depletion-layer jet etching, the rectifying contact 11 is reverse biased by voltage source 31 and a space charge is produced next to the junction. The germanium in the space-charge region becomes increasingly negative as one approaches the alloyed junction. The jet stream 33 is also made negative by voltage source 32 with respect to Kovar ring 14, and will anodically etch the germanium until it reaches the space-charge contour that is more negative than the voltage of the jet stream as it impinges on the germanium surface. Etching now takes place along the surface of this space-charge contour. The bottom of the etched depression changes from bowl shaped to flat. When the electrolyte reaches the space-charge region, the current of the reverse-biased rectifying contact increases, and as the etching continues, this current continues to increase. At a predetermined value of this current the etching voltage is removed and the jet turned off.

The space-charge region which is not etched out and becomes the base region of the diode follows the contours of the original rectifying junction and the base thickness is uniform. For n-type germanium the width of the space charge region is given by Equation 1, where, in this case $V_p$ is the reverse bias voltage during jet etching less the etching potential of the impinging jet stream. Thus by controlling the voltage applied to the junction and the voltage applied to the jet stream the thickness of the resulting base stream can be accurately controlled to the order of $10^{-4}$ cm.

One advantage of depletion-layer jet etching over bath etching is that the space charge region tends to follow the contours of the original rectifying junction, and thus a more uniform base thickness is left in depletion-layer etching if there are significant irregularities in the original junction. This advantage is not too important because planar alloy junctions are regularly obtained on germanium dice oriented in the [111] direction. Also, it is difficult to align the jet so that the etch pit is perfectly concentric with the rectifying contact. If the jet is slightly off center and etching is continued in an effort to obtain a flat depression opposite the entire area of the alloyed junction, there is a risk that the germanium will etch through to one side of the contact 11.

A third method for producing narrow base diodes is described in detail in an application by Robert Rediker and John Halpern, Serial No. 653,817, filed April 19, 1957, for "Method for Fabricating Outdiffused Junctions" and assigned to the same assignee as the present application, and now abandoned. The donor impurities arsenic, antimony and phosphorus have much higher diffusion constants in germanium than the acceptor impurities boron, gallium and indium. If compensated n-type germanium is heated in vacuum, the donor impurities will diffuse out of the germanium more rapidly than the acceptor impurities. If the initial donor and acceptor densities are properly chosen for a compensated n-type wafer, outdiffusion will produce a graded p-type skin that serves as the narrow base of the diode. Other process variables, heating time, temperature and surface evaporation velocity must be considered.

The compressed n-type germanium, which is the starting material, can be obtained by growing crystals doped with both antimony and indium, a suitable doping for diode fabrication would, for example, be indium doped 0.5 ohm-cm. p-type germanium compensated to 0.5 ohm-cm. n-type by antimony doping. The p-type skin is developed by heating the compensated germanium in a vacuum of $10^{-6}$ mm. Hg or better at a temperature of 700° C. Heating for a period of twenty-four hours produces a skin having a thickness of about three microns. A greater thickness of p-type skin can be obtained either by outdiffusion for longer periods of time or at higher temperatures.

In fabricating the diode, the outdiffused skin is etched or lapped off one face of the germanium wafer. As shown in Figure 2, an ohmic contact to the n-type bulk 12 is made by bonding a gold plated antimony tab 15 to the entire face of freshly exposed n-type germanium. The ohmic contact 16 to the p-type skin 17 is then made. The ohmic contact 16 is then masked and etched to define the area of the p-n junction 13 by conventional methods. Care must be taken in this last etching step not to etch too deeply into the n-type bulk 12 lest the diode series resistance be increased.

The skin produced by outdiffusion is graded, being more heavily p-type away from the junction. The graded doping gives rise to a built-in electric field which is such as to oppose the flow of electrons, the minority carriers in the present illustration, from the junction to the ohmic contact on the p-type skin. While this field has the effect of increasing the electron storage time, it helps to clear the stored charge when the diode is switched from forward to reverse bias, and hence most of these electrons are removed at the maximum current permitted by the external circuit. Further, the resistivity of the outdiffused graded base is higher near the junction and lower near the ohmic contact than the resistivity of the equivalent uniformly doped base. Because of the higher resistivity near the junction, the junction capacitance is smaller and the breakdown voltage larger for the outdiffused diode than for the equivalent uniformly doped base diode.

After the narrow base width has been produced by either of the three processes described above, ohmic contact must be made to the thin base region. In order to maintain the base width control of these processes, the penetration of the ohmic contact into the base material must be kept to a minimum. Ohmic contacts can be made by plating, evaporation, alloying and soldering. I prefer to make the ohmic contact to the narrow base region by plating on the germanium surface that has first been abraded with a spray of an aqueous suspension of either 5 or 0.5 micron particle size alumina from an artist's air brush. Several different metals have been found to make successful contacts, such as: gold-antimony alloy plated from a cyanide bath, indium plated from a cyanide bath, or for jet-etched devices, indium jet plated from a chloride solution. For the devices which have been made by etching, after the ohmic contact has been made at the bottom of the etched depression it is connected to the ohmic ring contact with conducting paint or with a low temperature solder. Although these diodes have a very narrow base region, this region is backed by the p-type recrystallized region and the indium button and thus are as rugged as conventional diodes.

A low temperature solder may be used in making connection to the plated ohmic contact of the devices made by the outdiffusion technique. Since the narrow base regions of the outdiffused diodes are backed by much thicker wafers of germanium, these devices are also as rugged as conventional germanium rectifiers.

It should be clearly realized that an important parameter of the punch-thru diode, the punch-thru voltage, is directly controlled in fabrication by the etching techniques by controlling the base width W as described above. No other semiconductor diode possesses such an accurately controlled breakdown voltage. For n-type germanium, the punch-thru voltage has been accurately controlled over the range of 1.0 to 100 volts. No valid reason is apparent to prevent extending this range from below 0.01 volt to about 1000 volts, although for the lower voltages the inherent electrostatic potential of the p-n junction must be considered.

The punch-thru voltage depends on the number of fixed charges in the base material and on the effective thickness of the base region: $V_p=KN_oW^2$, where $N_o$ is the number of donors per cm.$^3$ in the base material, K is temperature independent and W is the physical base width minus small transition regions near both contacts. The punch-thru voltage is relatively insensitive to changes in temperature. The temperature dependence is caused by the temperature dependence of the transition regions under the contacts to the base as discussed in the paper by Oliver Carrels, "Variation of the Punch-Through Voltage of a Transistor as a Function of Temperature," Compte Rendu, Academie de Science, France, volume 241, page 857, 1955.

With reference to Figure 1, a typical diode fabricated by the foregoing method may start with an n-type germanium wafer 12 0.130 inch square and 0.008 inch thick, although these dimensions are not critical but are chosen so that the wafer can be readily handled manually. Rectifying contact 11 is approximately 0.075 cm. in diameter, and the area of the flat bottom of the etched hole matches the area of contact 11. Ohmic contact 16 is made to the flat bottom. The active area of the diode is very closely $$\frac{\pi}{4}(.075)^2=0.0045 \text{ cm.}^2$$

The width of the layer of recrystallized p-type germanium between contact 11 and junction 13 may be in the order of 0.006 cm. and the width W of n-type germanium in the base region controlled during manufacture to 0.0008 cm.

A diode, controlled in manufacture, to the above dimensions for a resistivity of n-type germanium of the order of 4 ohm-cm., has been found to have a forward impedance below 3 ohms and a reverse impedance above 1 megohm. At 1 ma. forward current the diode voltage drop is less than 0.10 volt. The dynamic impedance in the punch-thru region is between 100 and 500 ohms, apparently depending on the type of sandblasting used before plating the ohmic contact. The punch-thru voltage, controlled during manufacture is 20 volts.

Diodes have been fabricated in which the diameter of the rectifying contact has been as small as 0.005 cm. and as large as 0.25 cm. and thus produced diodes with active areas as low as 0.00002 cm.$^2$ and as large as 0.049 cm.$^2$. These extreme values of diode active area are by no means limiting values either from a theoretical or practical point of view but are the limits of experience to date. Diodes have been fabricated in which the width W of the n-type germanium in the base region has been controlled during manufacture to as low as 0.0001 cm.

The switching time from forward low impedance to reverse bias high impedance is found by measurement to be in the order of $10^{-7}$ seconds. The switching time between the high impedance reverse bias region and the low impact punch-thru region is exceedingly fast, of the order of $10^{-8}$ seconds.

At an ideal ohmic contact, there is no change in the carrier densities irrespective of the current flow. The operation of very narrow base punch-thru diodes has been found to be sensitive to deviations from ideal behavior of the ohmic contact. The deviation from ideal for an ohmic contact may be expressed as the ratio S of current flow to the change in the charge of minority carriers at the contact:

$$S=\frac{J}{q(P-P_n)}$$

where J is current density, $P_n$ is the equilibrium minority carrier density in the base region, P is the minority carrier density in the base at the contact, and $q$ is the electronic charge. The quantity S has the dimensions of velocity and is analogous to the surface-recombination velocity.

If one includes the deviation from ideal behavior of the ohmic contact, the current in a planar alloy-junction diode is given by $$I/A=\frac{qDp_n}{L}\left(\frac{D\sinh\frac{W}{L}+sL\cosh\frac{W}{L}}{D\cosh\frac{W}{L}+sL\sinh\frac{W}{L}}\right)\{\exp[qV/kT]\} \quad (2)$$

where $p_n$ is the equilibrium value of minority carriers in the base, W is the width of the base region, T is the lifetime and L is the diffusion length, $L=\sqrt{DT}$, for holes in the n-type germanium base. D is the diffusion constant, 44 cm.²/sec. for holes in n-type germanium. For narrow-base diodes where $W<<L$, Equation 2 reduces to $$I/A=\frac{qDp_n}{W}\left(\frac{1}{1+\frac{D}{sW}}\right)\{\exp[qV/kT]-1\} \quad (3)$$

or $$I/A=qp_ns\left(\frac{1}{1+\frac{sW}{D}}\right)\{\exp[qV/kT]-1\} \quad (3a)$$

Equation 3a is derived from Equation 3 by multiplying numerator and denominator by $sW/D$. For $$L>>W>>D/s$$

the second fraction in Equation 3 is close to unity and the saturation current is an inverse function of the effective base width W. As the diode reverse voltage is increased and the space-charge region becomes larger, the effective base width decreases and the reverse current increases, and does not saturate. If, on the other hand, $W<<D/s$, the second fraction in Equation 3a is close to unity, the reverse current is independent of W and does saturate because all the generated carriers are collected; there are no further carriers to collect irrespective of base width. For the diodes fabricated as described the fraction $$\frac{sW}{D}$$

has been such to be always consistent with a reverse impedance about 1 megohm.

The switching speed of planar alloyed diodes, such as the punch-thru diode designed for computer service, is limited by the time it takes to switch the diode from its forward low-impedance to its reverse high-impedance state. This reverse recovery time has, until now, been determined by the time necessary to remove the holes that are stored in the diode when it is in its forward low-impedance state. These stored holes must be removed before the diode will exhibit the high impedance normally associated with its reverse bias state.

Although the hole-storage switching time varies with the circuit used, the ratio of the forward current to the charge of the holes stored during forward conduction depends only on the physical parameters of the diode. This ratio which can be considered a figure of merit for the diode is related to the reciprocal of the hole-storage switching time.

The figure of merit for the planar alloy-diode, including the deviation from the ideal behavior of the ohmic contact is given by:

$$\frac{I_f}{Q_h}=\frac{I}{T}\times\frac{\sinh\frac{W}{L}+\frac{SL}{D}\cosh\frac{W}{L}}{\sinh\frac{W}{L}+\frac{SL}{D}\left(\cosh\frac{W}{L}-1\right)} \quad (4)$$

For the narrow base diode $W<<L$ the figure of merit relationship reduces to:

$$\frac{I_f}{Q_h}=\frac{2D}{W^2}\times\frac{1}{1+\frac{2D}{SW}} \quad (5)$$

and for limiting small base widths $$W\ll\frac{D}{S}$$

the figure of merit becomes:

$$\frac{I_f}{Q_h}=\frac{S}{W} \quad (6)$$

For n-type germanium a value of S of $5\times10^4$ cm./sec. is a reasonable value of surface recombination at a sand-blasted surface. Punch-thru diodes having a controlled base width of $10^{-3}$ cm. are easily made and have figures of merit, of $3.2\times10^{-7}$ seconds, calculated from Equation 6.

Up to the present, hole storage has always been considered the factor which set the lower limit to the time required to switch an alloy junction diode from its forward low impedance to its reverse bias high impedance state. In the punch-thru diode, which has a narrow base region of uniform thickness, the charge due to hole storage in forward conduction can be of the same magnitude or smaller than the charge stored in the space charge region in reverse bias. Thus in the punch-thru diode the junction capacitance rather than hole storage can limit switching speed.

For a base layer of n-type germanium, the charge in the depletion layer of an alloy junction with a back bias of $V_r$ volts is given by:

$$Q_D=2.8\times10^{-8}A\sqrt{\frac{V_r}{\rho}}\text{ coulombs} \quad (7)$$

where $\rho$ is the resistivity of the germanium in ohm-cm. and A is the junction area in square centimeters. Punch-thru diodes have been designed by proper choice of resistivity, area, and base thickness to minimize the effects of both junction capacitance and hole-storage on the reverse recovery time.

Figure 7:
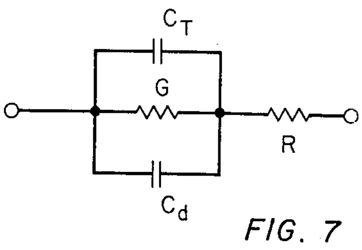
Figure 7 is the equivalent mixer-diode circuit.

Figure 7 illustrates the general form of the current-voltage characteristics of a punch-thru diode, although specific values are not shown. A high impedance region when the diode is reverse biased is shown. For typical punch-thru diodes the reverse bias high impedance exceeds 1 megohm. If the reverse bias voltage across the junction is increased to the critical value controlled in manufacture, $V_p$, the depletion layer will reach the ohmic contact and the diode switches into the low impedance punch-thru region. Typical punch-thru diodes having a punch-thru voltage of the order of 20 volts exhibit a dynamic punch-thru impedance of 100 to 500 ohms. Under the condition of forward bias, a region of low impedance is shown. As stated above, a forward impedance less than 3 ohms is easily obtained.

Although for purposes of illustration, dimensions of a particular diode structure suitable for computer service have been given and the desirable characteristics obtained therefrom have been assigned numerical values, punch-thru diodes have been successfully fabricated to possess predetermined structural dimensions and resultant characteristics deemed suitable for differing types of use. To give another example, Giacoletto and O'Connell in the R.C.A. Review, volume 17, page 68, 1956, have described the application of a narrow base alloyed diode as a variable capacitor at ultra high frequencies. An alloyed junction, when biased in the reverse direction acts as a capacitance which can be varied by the bias voltage. The figure of merit Q can be calculated from the physical dimensions and constants of the diode and has been shown to be inversely proportional to the product of series bulk resistance and junction capacitance.

$$Q=\frac{1}{2\pi fRC_T}=1.14\times10^{11}\frac{(V_j+V_o)^{1/2}}{\rho(V_p^{1/2}-V_j^{1/2})} \quad (8)$$

where $\rho$ is the resistivity of the base, $V_j$ is the voltage applied to the junction, $V_o$ is the internal contact potential of the junction, and $V_p$ is the punch-thru voltage. For a planar diode this product is independent of junction area. The very narrow base widths and hence very small bulk resistance produced by the methods described above yield diodes with a Q exceeding 100 at 100 mc.p.s. A punch-thru diode fabricated from n-type germanium having a resistivity of 0.5 ohm-cm., a contact diameter of 0.04 cm., a punch-thru voltage of 11 volts and a final base thickness of 2.3 microns should have the following electrical characteristics, computed from Equation 8, when at a 5 volts reverse bias:

$$\frac{dC}{dV} > 1 \ \mu\mu\text{f. volt}$$

$C_T < 12$ $\mu\mu$f. $R < 0.05$ ohm, $Q > 400$ at 500 mc.p.s. provided the values are considered to be based on the equivalent circuit of a diode in its high impedance state as shown in Figure 5 where R is the bulk series resistance, $C_T$ is the transition layer capacitance and G is the junction conductance. The nature of the ohmic contact has been found to exert considerable influence on the figure of merit Q of the completed diode, because the nature of the contact influences the effective series resistance of the completed diode. Preliminary devices have not as yet met the electrical specifications listed above due to the ohmic contact employed.

Figure 6:
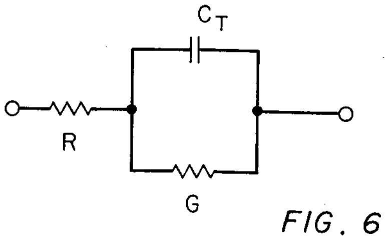
Figure 6 is the equivalent circuit of a diode in its high impedance state.

In addition to enhancing Q by reducing the bulk series resistance, the very narrow base width of the punch-thru diode also tends to reduce the diffusion capacitance. In Proc. I.R.E., volume 44, page 1183 (1956), A. Uhlir, Jr., pointed out that, for optimum mixer efficiency, the diode should be operated as a variable resistor. This means that the diode susceptance should be much smaller than its conductance. For a diode with a 2 micron base width and an ohmic contact with a generation velocity of 200,000 cm./sec., solution of the fundamental diffusion equation for the proper boundary conditions yields the result that the diffusion susceptance becomes equal to the conductance at a frequency of 160 mc.p.s. For UHF mixer applications in order to obtain a very small ohmic contact area to minimize junction capacitance, punch-thru diodes with 0.005 cm. diameter gold-bonded junctions have been fabricated using n-type germanium having a resistivity of 0.5 ohm-cm. to have a final base thickness of 1.6 microns and a punch-thru voltage of 5 volts. Since the base thickness for these gold-bonded junctions is about one twenty-fifth the diameter of the bond, diode theory based on planar alloy geometry describes the device accurately. Such diodes should have a bulk series resistance below 5 ohms, a junction capacitance of less than 1 $\mu\mu$f. and a Q exceeding 100 at a frequency of 100 mc.p.s. at zero applied bias volts. The equivalent circuit for the mixer diode 15 is shown in Figure 6, where R is the series bulk resistance, $C_T$ is the transition layer capacitance, $C_D$ is the diffusion layer capacitance, and G is the junction conductance. The realization of these electrical specifications also awaits further improvement of the ohmic contact.

It is seen that punch-thru diodes fabricated by the foregoing techniques exhibit characteristics not found in conventional diodes, namely, a rapid switch from a high impedance reverse bias state to a low impedance reverse bias state at value of applied voltage which is accurately controlled during manufacture. Because of the very small spacing between the rectifying junction and the ohmic contact, hole storage effects as well as forward switching effects are minimized and the punch-thru diode can be used in fast switching applications at rates up to and possibly exceeding 10 mc.p.s. Because of the plane parallel structure, forward resistances below 5 ohms and voltage drops of less than 0.1 volt can be obtained for 1 milliampere forward current, values heretofore not obtained for conventional diodes. In addition, the switching time between the low impedance punch-thru region and the high impedance reverse bias region is exceedingly rapid.

Having thus described the invention, I claim:

1. An impure semiconductor planar junction diode comprising a wafer of base material having concentric rectifying and ohmic contacts on opposite sides thereof the width of the base material between said contacts being such that the diode electrical characteristics depend on the value of the ohmic contact generation velocity S which is the ratio of current flow to the change in the charge of minority carriers at said ohmic contact.

2. An impure semiconductor planar junction diode comprising a wafer of base material having concentric rectifying and ohmic contacts on opposite sides thereof, the width of base material between said contacts being of the order of magnitude of the ratio D/S where D is the diffusion constant for minority carriers in said base material and S is the ratio of current flow to the change in charge of minority carriers at said ohmic contact.

3. An impure semiconductor planar junction diode having three stable states of conduction comprising a wafer of impure semiconductor material having a rectifying junction contact formed on one surface thereof and an ohmic contact placed on the second surface thereof, the width of base material in the layer between said rectifying junction and said ohmic contact being such that the space charge region in said base reaches said ohmic contact for a predetermined voltage applied across said junction whereby said diode possesses a high impedance characteristic at a reverse bias below said predetermined voltage, and low impedance characteristics at a reverse bias above said predetermined voltage and with forward bias.

4. An impure semiconductor planar alloy junction diode comprising a wafer of n-type germanium, a disc of metallic indium alloy placed on one surface thereof, a layer of recrystallized p-type germanium within said wafer formed by heat fusion of indium from said disc into said wafer to produce a rectifying planar alloy junction, and an ohmic contact on the second surface of said wafer concentric with said indium disc, the width of n-type germanium between said ohmic contact and said layer of p-type germanium being cf the order of magnitude of $D/S$, where D is the diffusion constant for holes in n-type germanium and S is the ratio of current flow to change in the charge of minority carriers at said ohmic contact.

5. An impure semiconductor planar alloy junction diode comprising a wafer of n-type germanium, a disc of metallic indium placed on one surface thereof, a layer of recrystallized p-type germanium within said wafer formed by heat fusion of indium from said disc into said wafer to produce a rectifying planar alloy junction, and an ohmic contact on the second surface of said wafer concentric with said indium disc, the width of n-type germanium between said ohmic contact and said layer of p-type germanium being less than the diffusion length for minority carriers in n-type germanium and equal to the space charge region in said wafer for a predetermined reverse bias voltage applied across said contacts whereby said space charge region reaches said ohmic contact to shift said diode from a state of high impedance to a state of low impedance at said predetermined reverse bias voltage.

6. An impure semiconductor planar alloy junction diode comprising a wafer of n-type garmanium, a disc of metallic indium placed on one surface thereof, a layer of recrystallized p-type germanium within said wafer formed by heat fusion of indium from said disc into said wafer to produce a rectifying planar alloy junction, and an ohmic contact on the second surface of said wafer concentric with said indium disc, the width of n-type germanium between said ohmic contact and said layer of p-type germanium being equal to the width of the space charge region in said n-type germanium for a predetermined voltage applied across said alloy junction to cause said space charge region to reach said ohmic contact at said predetermined voltage and shift said diode from a state of high impedance to a state of low impedance.

7. An impure semiconductor planar alloy junction diode having three stable states of conduction comprising a wafer of n-type germanium, a disc of metallic indium plated on one surface thereof, a layer of recrystallized p-type germanium within said wafer formed by heat fusion of indium from said disc into said wafer formed by heat diffusion of indium from said disc into said wafer to produce a rectifying planar alloy junction, and an ohmic contact on the second surface of said wafer concentric with said indium disc, the width of n-type germanium between said ohmic contact and said layer of p-type germanium being such that the space charge region in said n-type germanium layer reaches said ohmic contact for a predetermined applied voltage whereby said diode possesses a high impedance at a reverse bias below said voltage and low impedance at a reverse bias above said voltage and with a forward bias.

8. An impure semiconductor planar junction diode comprising a wafer of compensated n-type germanium having an ohmic contact placed on one surface thereof, a p-type skin produced on the second surface of said wafer by the outdiffusion of donor impurity elements to form a rectifying junction at the graded transition from n-type germanium to p-type germanium, the width of said skin corresponding to the width of the space charge region in said p-type germanium for a predetermined voltage applied across said junction, and a second ohmic contact placed on the outer surface of said p-type skin.

9. An impure semiconductor planar junction diode comprising a wafer of base material having a rectifying junction contact formed on one surface and an ohmic contact concentric therewith on the second surface thereof, the width of said base material in the region between said contacts being much smaller than the diffusion length for minority carriers in said base material and equal to the space charge region in said base region for a predetermined reverse bias voltage applied across said contacts whereby said space charge region reaches said ohmic contact to shift said diode from a state of high impedance to a state of low impedance at said predetermined voltage.

10. A diode as defined in claim 9 wherein the width of said base region is related to the impurity concentration of said base material and to said applied voltage in accordance with the expression $W=K\sqrt{V/N_0}$, where W is the effective base width, V is the applied voltage, $N_0$ is the net impurity density of base material, and K is a temperature independent constant.

11. A diode as defined in claim 9 wherein the width of said space charge region reaches said ohmic contact at an applied reverse bias voltage lower than the voltage at which impact ionization or Zener breakdown occurs.

12. An impure semiconductor planar junction diode comprising a wafer of compensated n-type germanium having an ohmic contact placed on one surface thereof, a p-type skin produced on the second surface of said wafer by the outdiffusion of donor-impurity elements to form a rectifying junction at the graded transition from n-type to p-type germanium, a second ohmic contact placed on the outer surface of said skin, the width of said skin being such that the space charge region in said skin extends from said junction to said second ohmic contact for a predetermined reverse bias voltage applied across said first and second ohmic contacts whereby said diode possesses a high impedance at a reverse bias below said predetermined voltage and a low impedance at a reverse bias above said predetermined voltage and with forward bias.

References Cited in the file of this patent

UNITED STATES PATENTS

| | | |
|---|---|---|
| 2,756,374 | Colleran et al. | July 24, 1956 |
| 2,792,539 | Lehovec | May 14, 1957 |
| 2,846,346 | Bradley | Aug. 5, 1958 |
| 2,849,664 | Beale | Aug. 26, 1958 |

FOREIGN PATENTS

| | | |
|---|---|---|
| 753,133 | Great Britain | July 18, 1956 |